(12) United States Patent
Kupershmidt et al.

(10) Patent No.: US 7,548,567 B2
(45) Date of Patent: Jun. 16, 2009

(54) ANALOG TRANSMITTER USING AN EXTERNAL CAVITY LASER (ECL)

(76) Inventors: Vladimir Kupershmidt, 3124 Weymouth Ct., Pleasanton, CA (US) 94588; John Major, 1712 Via Lugano, San Jose, CA (US) 95120; Sabeur Siala, 714 Pierino Ave., Sunnyvale, CA (US) 94086

( * ) Notice: Subject to any disclaimer, the term of this patent is extended or adjusted under 35 U.S.C. 154(b) by 516 days.

(21) Appl. No.: 11/097,746

(22) Filed: Apr. 1, 2005

(65) Prior Publication Data

US 2005/0220458 A1     Oct. 6, 2005

Related U.S. Application Data

(60) Provisional application No. 60/638,679, filed on Dec. 23, 2004, provisional application No. 60/562,762, filed on Apr. 16, 2004, provisional application No. 60/558,927, filed on Apr. 2, 2004.

(51) Int. Cl.
     *H01S 3/04*      (2006.01)
(52) U.S. Cl. ............................. 372/34; 372/36; 372/96; 372/102
(58) Field of Classification Search .................. 372/34, 372/33, 96, 102
See application file for complete search history.

(56) References Cited

U.S. PATENT DOCUMENTS

| | | | |
|---|---|---|---|
| 3,794,841 A | 2/1974 | Cosentino et al. | |
| 4,156,206 A | 5/1979 | Comerford et al. | |
| 4,466,694 A | 8/1984 | MacDonald | |
| 4,704,720 A | 11/1987 | Yamaguchi | |
| 4,786,132 A | 11/1988 | Gordon | |
| 4,992,754 A | 2/1991 | Blauvelt et al. | |
| 5,003,546 A | 3/1991 | Lidgard et al. | |
| 5,161,044 A | 11/1992 | Nazarathy et al. | |
| 5,172,068 A | 12/1992 | Childs | |
| 5,227,736 A | 7/1993 | Tucker et al. | |
| 5,252,930 A | * 10/1993 | Blauvelt | 330/149 |
| 5,257,124 A | 10/1993 | Glaab et al. | |
| 5,424,680 A | 6/1995 | Nazarathy et al. | |
| 5,430,569 A | 7/1995 | Blauvelt et al. | |
| 5,436,749 A | 7/1995 | Pidgeon, Jr. et al. | |

(Continued)

OTHER PUBLICATIONS

R.G. Harrison and D. Yu, "Stimulated Brillouin Scattering", Chapter 0.1, R. Pike and P. Sabatier, eds., *Scattering: Scattering and Inverse Scattering in Pure and Applied Science*, © 2001, Academic Press, pp. 1-11.

(Continued)

*Primary Examiner*—Minsun Harvey
*Assistant Examiner*—Kinam Park

(57) ABSTRACT

The present invention relates to an analog transmitter using an external cavity laser (ECL) in which specific characteristics of the ECL are enhanced and exploited to improve 2nd and 3rd order distortion while increasing the threshold for the occurrence of deleterious stimulated Brillouin scattering (SBS). The performance of the ECL shows a substantial reduction in distortion occurring over certain narrow ranges of operating temperatures. Optical, electronic, thermal and/or mechanical methods are described that cause this "distortion dip" to be moved to, or created at, stable regions of ECL operation, away from mode hops. Methods are also described that allow the distortion dip to be moved to, or created at, ECL operating regions in which sufficiently high chirp occurs, thereby reducing SBS. Transmitters and other devices employing these and related techniques are also described.

14 Claims, 15 Drawing Sheets

U.S. PATENT DOCUMENTS

| | | | |
|---|---|---|---|
| 5,453,868 | A | 9/1995 | Blauvelt et al. |
| 5,485,481 | A | 1/1996 | Ventrudo et al. |
| 5,717,804 | A | 2/1998 | Pan et al. |
| 5,812,716 | A | 9/1998 | Ohishi |
| 5,845,030 | A | 12/1998 | Sasaki et al. |
| 5,870,417 | A * | 2/1999 | Verdiell et al. ............ 372/32 |
| 6,122,085 | A | 9/2000 | Bitler |
| 6,207,950 | B1 | 3/2001 | Verdiell |
| 6,246,965 | B1 | 6/2001 | Cockerham et al. |
| 6,252,693 | B1 | 6/2001 | Blauvelt |
| 6,356,679 | B1 | 3/2002 | Kapany |
| 6,373,644 | B1 | 4/2002 | Flanders |
| 6,416,937 | B1 | 7/2002 | Flanders et al. |
| 6,535,315 | B1 | 3/2003 | Way et al. |
| 6,538,789 | B2 | 3/2003 | Sun |
| 6,661,814 | B1 | 12/2003 | Chapman et al. |
| 6,661,815 | B1 | 12/2003 | Kozlovsky et al. |

OTHER PUBLICATIONS

R. Wyatt, W.J. Devlin, "10 kHz Linewidth 1.5μm InGaAsP External Cavity Laser with 55nm Tuning Range", *Electronic Letters*, vol. 19, pp. 110-112, 1983.

D.M. Bird et al, "Narrow Line Semiconductor Laser Using Fibre Grating", *Electronics Letters*, vol. 27, Issue 13, pp. 1115-1116, Jun. 20, 1991.

M. Ziari et al., "High-Speed Fiber-Grating-Coupled Semiconductor Wavelength-Division Multiplexed Laser". *CLEO '97*, paper CMGI, May 20-22, 1997, Baltimore, MD, p. 27.

M.S. Whalen et al., "Tunable Fibre-Extended-Cavity Laser", *Electronics Letters*, vol. 23, No. 7, pp. 313-314, Mar. 1987.

C.A. Park et al., "Single-Mode Behavior of a Multimode 1.55 μm Laser With a Fire Grating External Cavity", *Electronics Letters*, vol. 22, No. 21, pp. 1132-1133, Oct. 9, 1986.

E.E. Bergmann et al., "Dispersion-Induced Composite Second-Order Distortion at 1.5 μm", *IEEE Photonics Technology Letters*, vol. 3, No. 1, pp. 59-61, Jan. 1991.

C.Y Kuo and E.E. Bergmann, "Erbium-Doped Fiber Amplifier Second-Order Distortion in Analog Links and Electronic Compensation", *IEEE Photonics Technology Letters*, vol. 3, No. 9, pp. 829-831, Sep. 1991.

C.Y. Kuo, "Fundamental Second-Order Nonlinear Distortions In Analog AM CATV Transport Systems Based on Single Frequency Semiconductor Lasers", *Journal of Lightwave Technology*, vol. 10, No. 2, pp. 235-243, Feb. 1992.

R. Nagarajan et al., "Millimeter Wave Narrowband Optical Fiber Links Using External Cavity Semiconductor Lasers", *Journal of Lightwave Technology*, vol. 12, No. 1, pp. 127-136, Jan. 1994.

L. A. Coldren and T. L. Koch, "External-Cavity Laser Deisgn", *Journal of Lighwave Technology*, vol. LT-2, No. 6, pp. 1045-1051, Dec. 1984.

A. Lidgard and N.A. Olsson, "Generation and Cancellation of Second-Order Harmonic Distortion in Analog Optical Systems by Interferometric FM-AM Conversion", *IEEE Photonics Technology Letters*, vol. 2, No. 7, pp. 519-521, Jul. 1990.

T. E. Darcie et al., "Fiber-Reflection-Induced Impairments in Lightwave AM-VSB CATV Systems", *Journal of Lightwave Technology*, vol. 9, No. 8, pp. 991-995, Aug. 1991.

V. Sykes, "External-Cavity Diode Lasers for Ultra-Dense WDM Networks", *Lightwave*, Mar. 2001.

* cited by examiner

ANALOG TRANSMITTER USING AN EXTERNAL CAVITY LASER (ECL)

CROSS REFERENCE TO RELATED APPLICATIONS

This application claims priority from provisional patent application Ser. No. 60/558,927 filed Apr. 2, 2004, and provisional patent application Ser. No. 60/562,762, filed Apr. 16, 2004, and provisional patent application Ser. No. 60/638,679 filed Dec. 23, 2004, pursuant to one or more of 35 U.S.C. § 119, § 120, § 365. The entire contents of all cited provisional patent applications are incorporated herein by reference for all purposes.

BACKGROUND OF THE INVENTION

1. Field of Invention

This invention relates generally to the field of optical communications and, more particularly, to an analog transmitter and external cavity laser suited for use in optical communication systems.

2. Description of the Prior Art

Analog transmitters for both broadcast and narrowcast (QAM-format) applications in cable television (CATV) commonly use directly-modulated distributed feedback (DFB) lasers or externally modulated sources (continuous wave (CW) DFB laser plus an external modulator). The choice is primarily dictated by the applications, by the operating wavelength (typically 1310 nanometer-nm or 1550 nm), by the reach and optical power level. The various transmitter options generally have both advantages and disadvantages, typically relating to a few fundamental issues of analog transmission. The factors considered in evaluating transmitter options typically include, for example, the level of the distortion produced at the output of the transmitter, distortion degradation due to the presence of optical filters and/or optical amplifiers (such as erbium-doped-fiber amplifiers, EDFA), and dispersion occurring as the signal travels through single mode fibers, especially at 1550 nm wavelength.

Wavelength Division Multiplexing (WDM) allows the simultaneous transmission of multiple laser beams, each at a different wavelength, inside a single strand of an optical fiber. WDM can be used in all types of fiber-based optical systems including baseband digital systems, analog broadcast and narrowcast systems, and RF-over-fiber systems. Increasing the number of wavelength channels that can be transmitted simultaneously led to the introduction of dense WDM (DWDM). Standardization bodies such as the International Telecommunication Union (ITU) have introduced standards for DWDM systems specifying among other things the spacing between neighboring wavelengths (also referred to as ITU grid or standard grid). As an example, I.T.U. G.957 is a standards document titled "ITU-T Specification: Optical Interfaces For Equipments And Systems Relating To The Synchronous Digital Hierarchy".

Optical transmitters commonly employ methods to suppress stimulated Brillouin scattering (SBS). Simply stated, SBS is caused by a nonlinear optical-acoustic interaction inside single mode fibers. SBS can limit transmission reach (that is, transmission distance) and can also limit the maximum amount of optical power that can be launched into the fiber. Typical methods of SBS suppression include dithering of the transmitted signal with frequencies and format differing from those used for typical CATV transmissions.

Externally modulated transmitters seem to offer the best performance for many optical communication systems but at the expense of high cost, high optical coupling losses (typically about 5 to about 7 decibels, dB) and generally require sophisticated techniques for linearization of the analog signal.

Thus, a need exists in the art for improved optical transmission systems and components providing improved system performance, improved system reliability, and/or acceptable system performance at reduced cost.

SUMMARY OF THE INVENTION

The present invention relates to an analog transmitter that eliminates or significantly reduces the requirement for pre-distortion circuitry commonly used in the prior art to correct for second or third order distortion. Furthermore, some embodiments of the analog transmitters described herein reduce costs through the use of direct-modulated external cavity lasers and/or provide application-specific chirp levels. In addition, the analog transmitter described herein improves the level of SBS suppression leading to the elimination of electronic dithering or a reduction in the level of such dithering required. The advances described herein lead to reduced material and labor costs, enhanced link design performance, improved manufacturing margins, and relaxed requirements on the level of technical expertise that is required in system manufacturing.

The present invention further relates to and includes alternative transmitters making use of an external cavity laser (ECL or ECL laser) where specific characteristics of the ECL, particularly the so-called "one-sided butterfly" or "distortion dip", are enhanced and exploited in order to significantly improve $2^{nd}$ and $3^{rd}$ order distortion while providing an application-specific chirp. The proposed invention advances the state of the art of analog transmitters used in applications such CATV networks, sub-carrier multiplexed systems, RF-over-fiber and optical access. The analog transmitter and the analog ECL incorporated within such transmitter described in this invention can be applied at either the 1550 nm or 1310 nm wavelength bands of operation (as well as other wavelength bands, if desired). A schematic depiction of typical embodiments of the present analog transmitter is shown in FIG. 1.

The present analog transmitter relates further to the enhancement and use of the distortion dip by properly designing the ECL and the transmitter incorporating the ECL. Among the major aspects of this invention are the following which are further described in more detail below: (i) to increase the width of the distortion dip to relax the requirement on the temperature control loop and to allow for wider operating margins such that, in many cases, commonly-used temperature control loops are sufficient to simultaneously lock the transmitter at the distortion dip and to lock the emission wavelength at a specified value; (ii) to move the distortion dip away from the mode hop region of the laser to a more stable ECL operating region or to create another distortion dip away from the mode hop region; (iii) to tailor the chirp in such a way as to provide an advantageous chirp level at the distortion dip where the chirp is sufficiently large to reduce or suppress SBS but not so large as to limit the reach of the transmitted signal (in other words, an application-specific chirp); and (iv) to implement adaptive feedback control loops to lock the operation of the laser at the distortion dip where second order distortion is advantageously small and when the temperature control loop cannot adequately maintain operation of the laser at the distortion dip.

These are among the advantages achieved in accordance with various embodiments of the present invention as described in detail below.

BRIEF DESCRIPTION OF THE DRAWINGS

The drawings herein are not to scale and the depictions of relative sizes and scale of components within a drawing and between drawings are schematic and also not to scale.

To facilitate understanding, identical reference numerals have been used, where possible, to designate identical elements that are common to the figures.

Figure 1A:
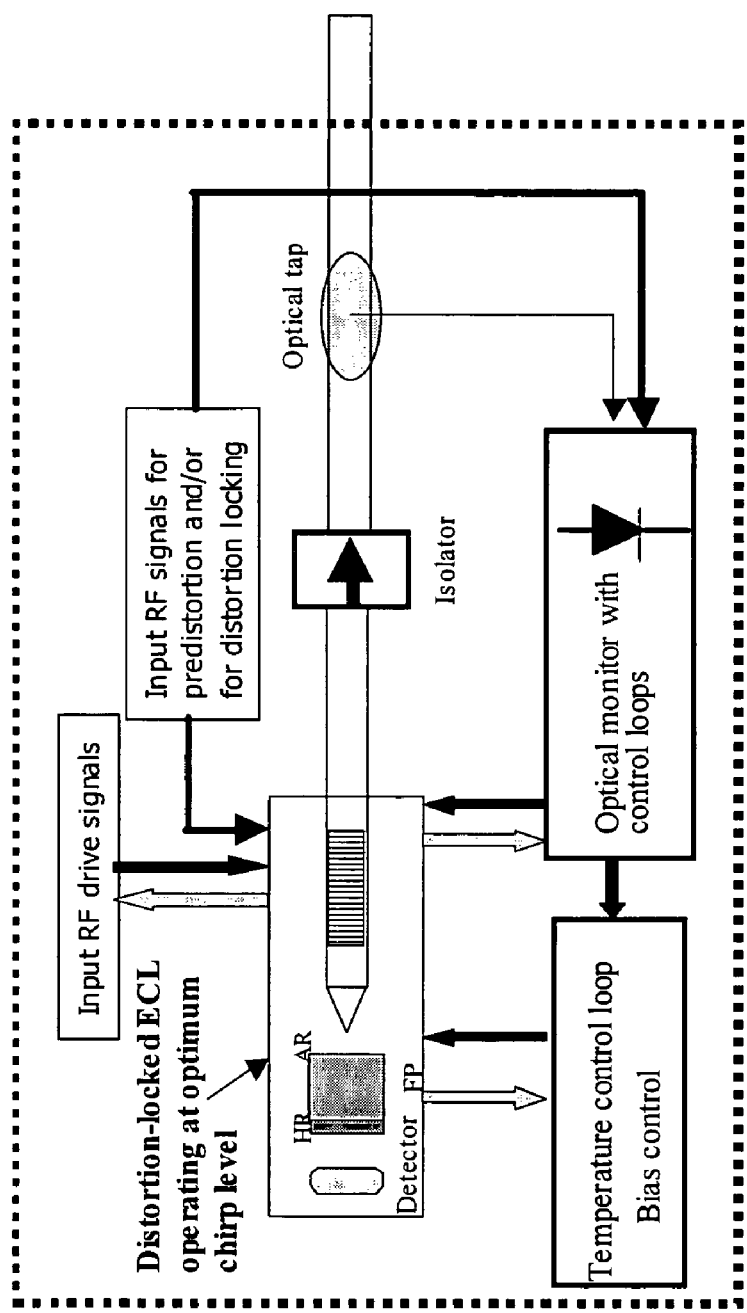
Figure 1B:
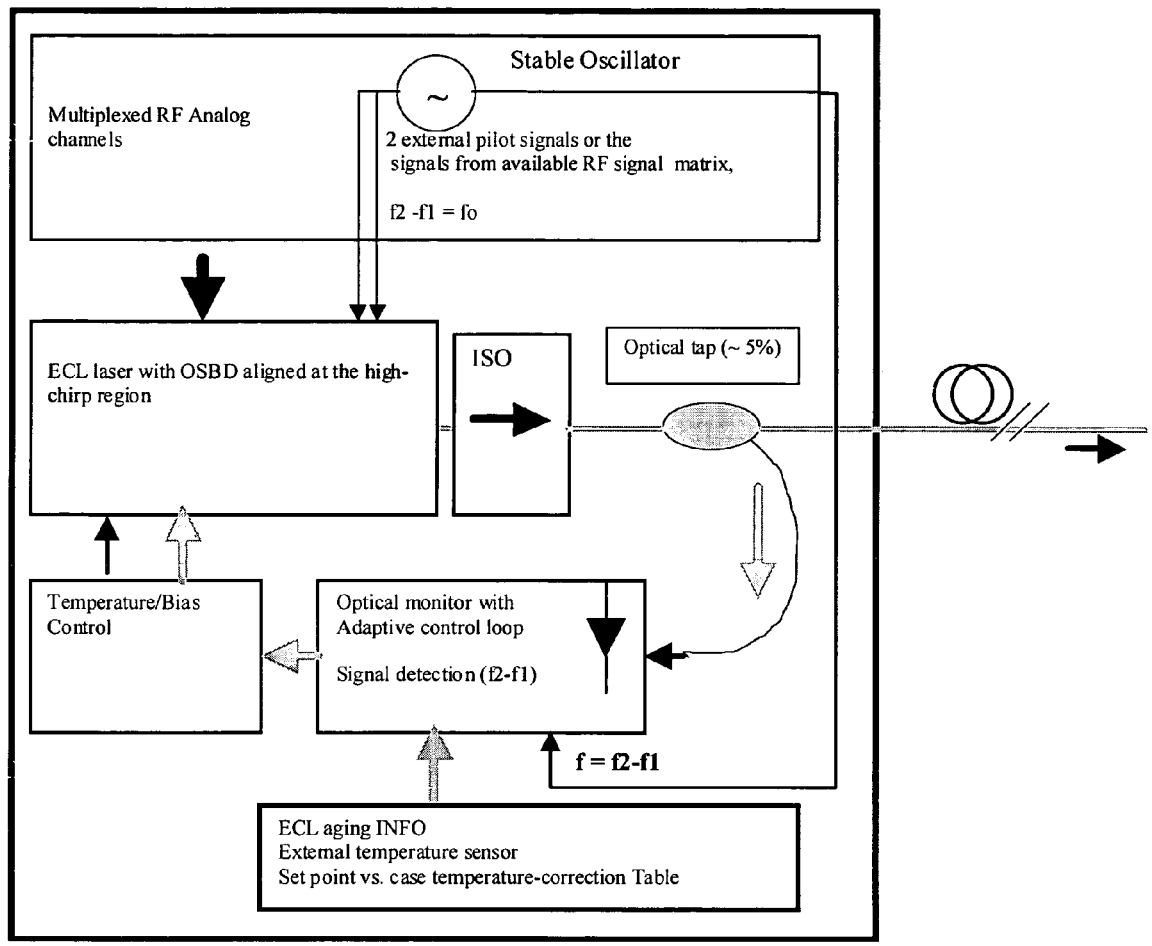

The techniques of the present invention can readily be understood by considering the following detailed description in conjunction with the following drawings, in which:

FIGS. 1a and 1b are a schematic, block diagram depictions of typical analog ECL transmitters pursuant to some embodiments of the present invention, incorporating an analog ECL laser having its low distortion dip aligned with the high chirp region.

Figure 2:
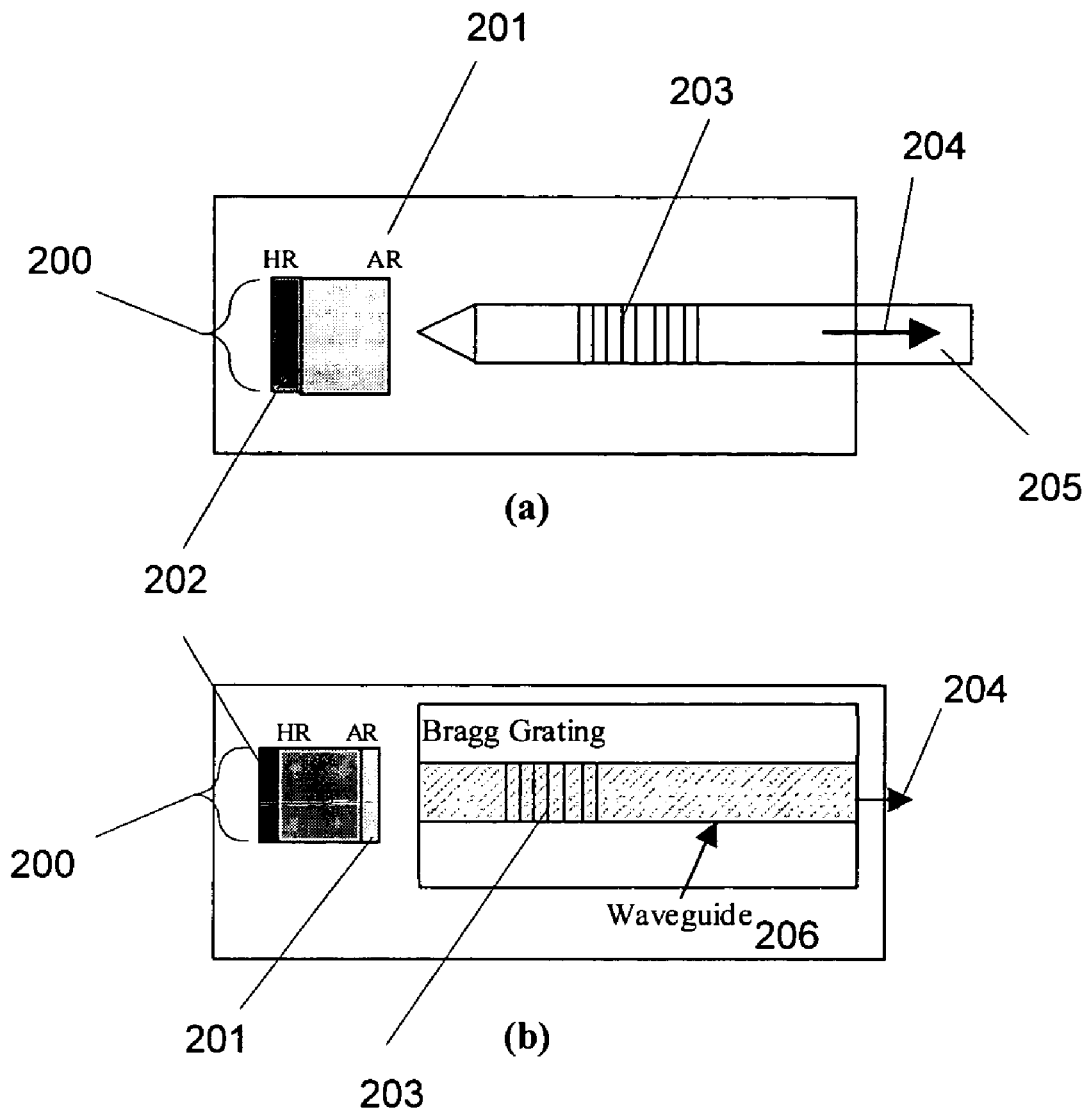

FIG. 2 is a schematic depiction of an ECL based on: (a) a fiber Bragg grating and (b) a grating written in the waveguide on a planar lightwave circuit (PLC).

Figure 3:
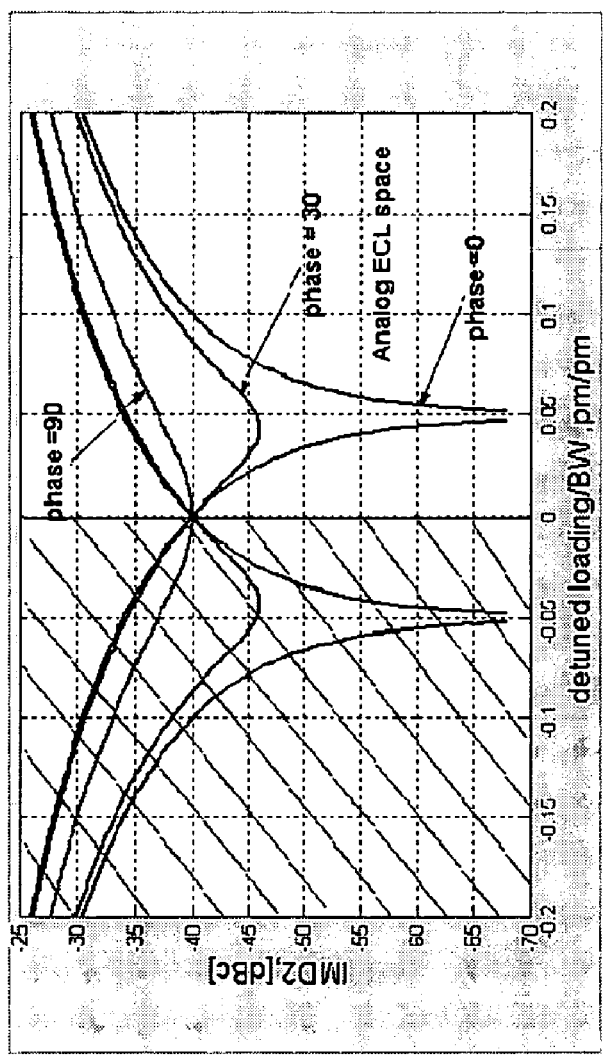

FIG. 3 is a graphical depiction of a typical $2^{nd}$ order distortion (for example, IMD2) as function of detuned loading, as generated by a transmitter incorporating a directly modulated laser with the laser's optical output passing through a narrow bandwidth optical filter with different phase delays $\phi$ between the chirp response and the intensity modulation. The dashed region of FIG. 3 is forbidden for ECL-based analog transmitters while the entire graph applies to optically-enhanced analog transmitters.

Figure 4:
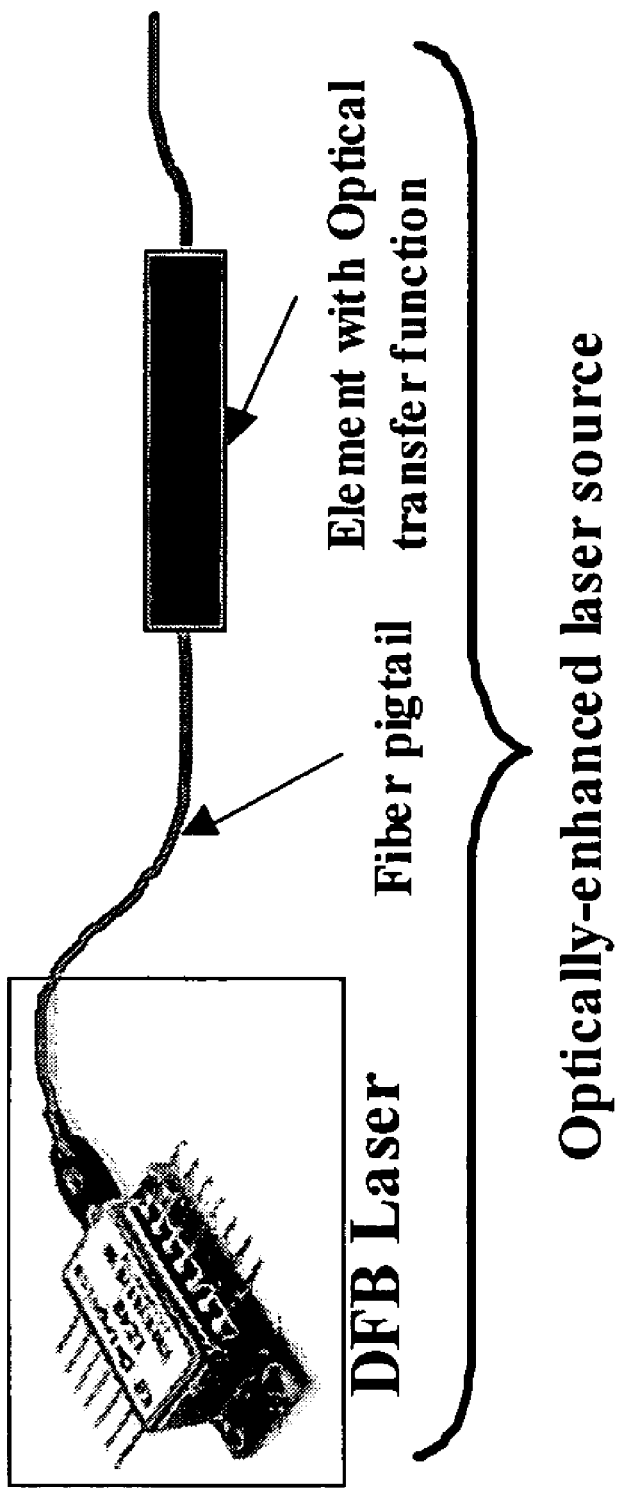

FIG. 4 depicts a typical optically-enhanced laser source in which optical predistortion can be used to improve the distortion performance of the solitary DFB laser.

Figure 5:
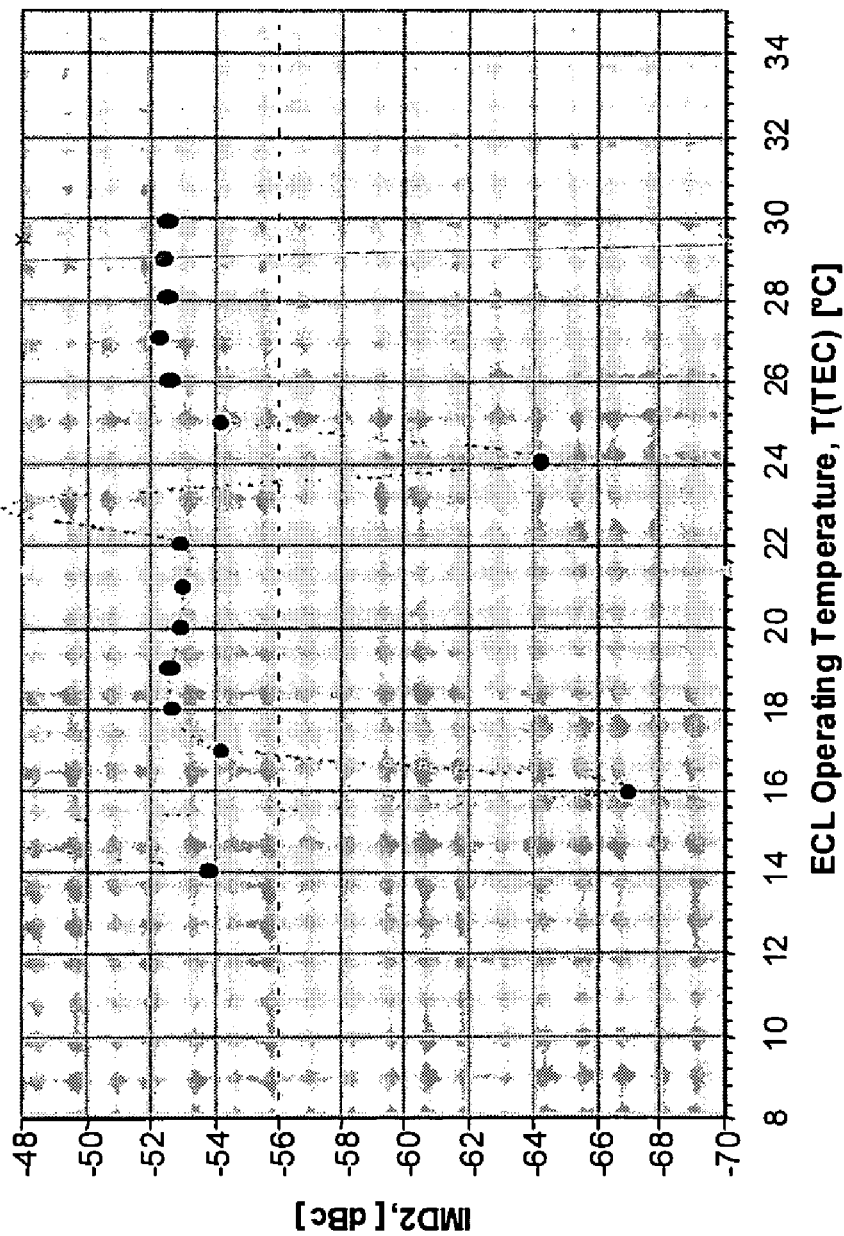

FIG. 5 is a graphical depiction of second order distortion as a function of operating temperature for an ECL-based transmitter, showing an intermodulation distortion region with a one-sided butterfly profile (distortion dip) that shows periodic behavior as a function of the operating temperature of the ECL (as can be controlled by a thermal electric cooler-TEC, for example).

Figure 6:
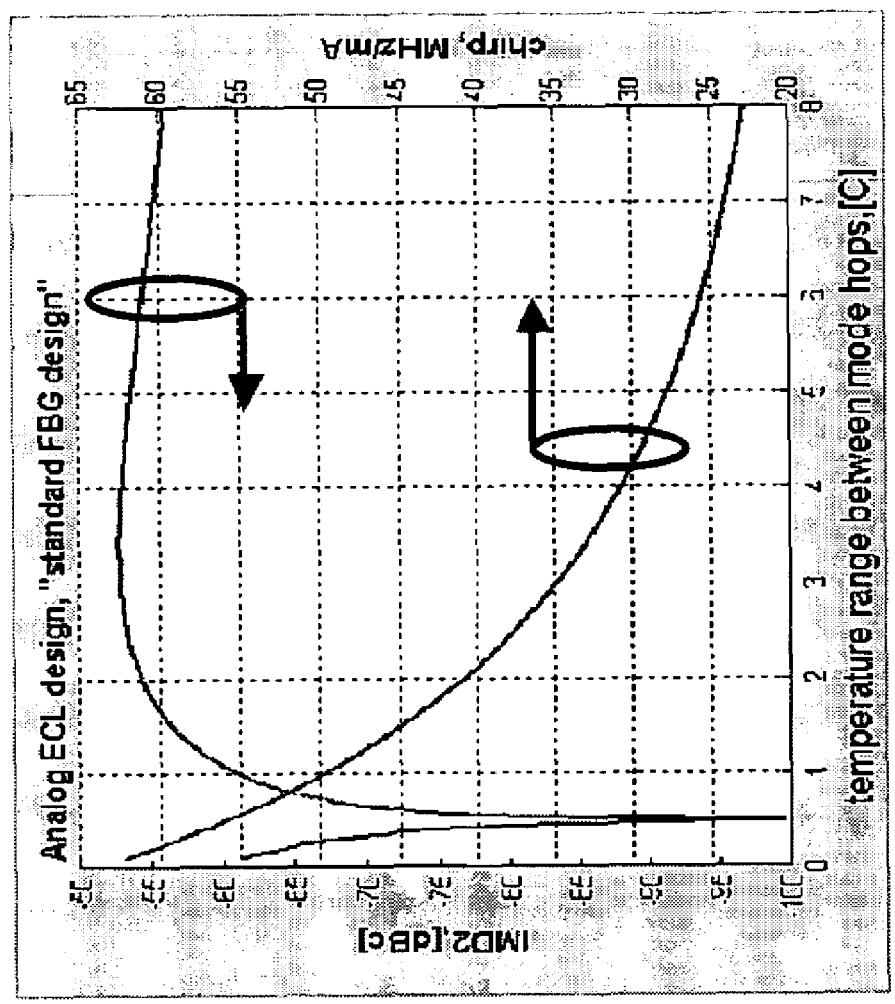

FIG. 6 is a graphical depiction of second order distortion (e.g., IMD2) and chirp as functions of the temperature range between mode hops for the particular embodiment of the FBG design for an analog ECL in which the one-sided butterfly profile (distortion dip) is aligned with a high chirp region. Experimental results are depicted.

Figure 7:
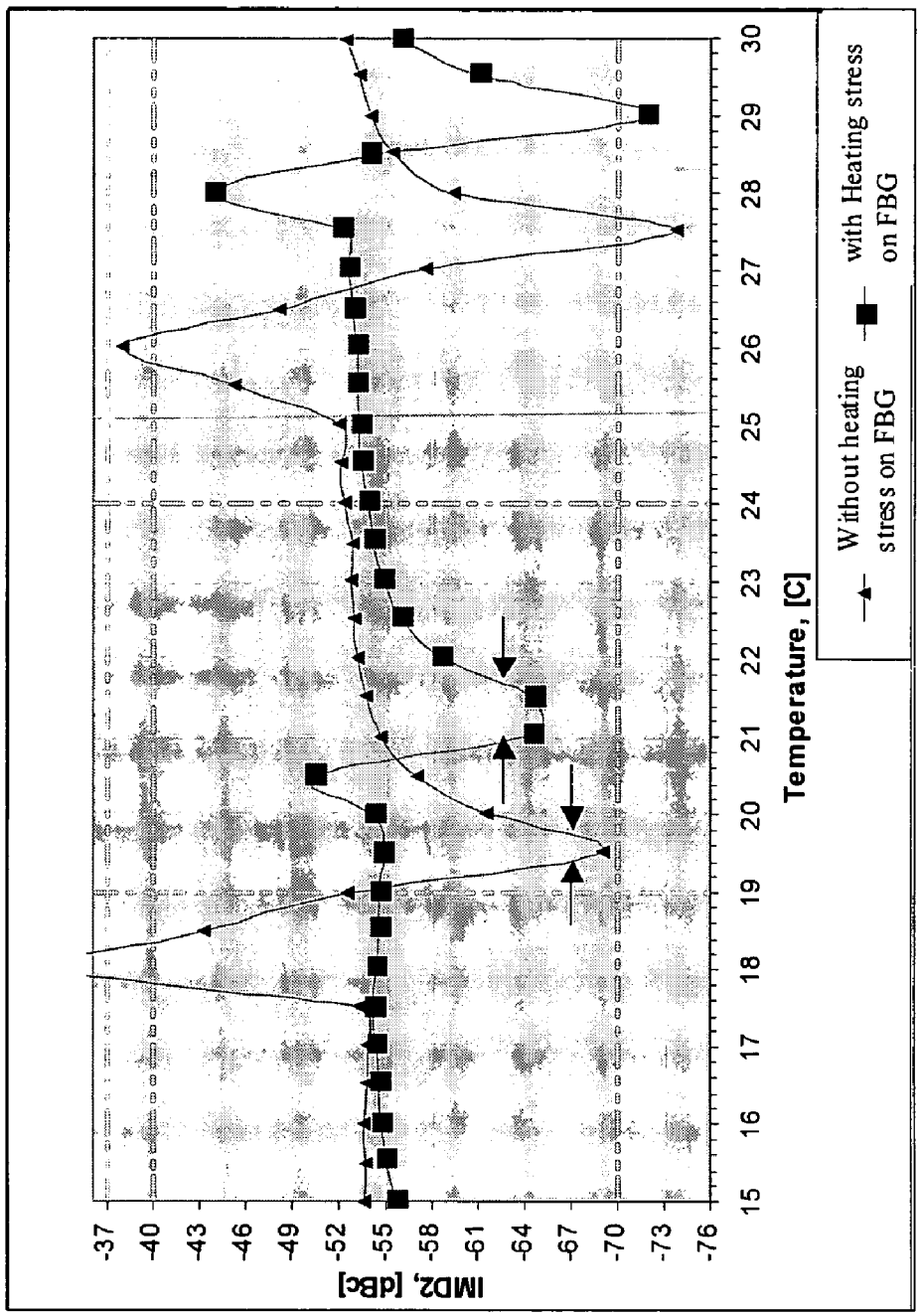

FIG. 7 is a graphical depiction of second order distortion (e.g., IMD2) as a function of laser temperature with (■) and without (▲) thermal (heating) stress applied to the fiber Bragg grating (FBG). Thermal stress is seen to result in a widening of the distortion dip.

Figure 8:
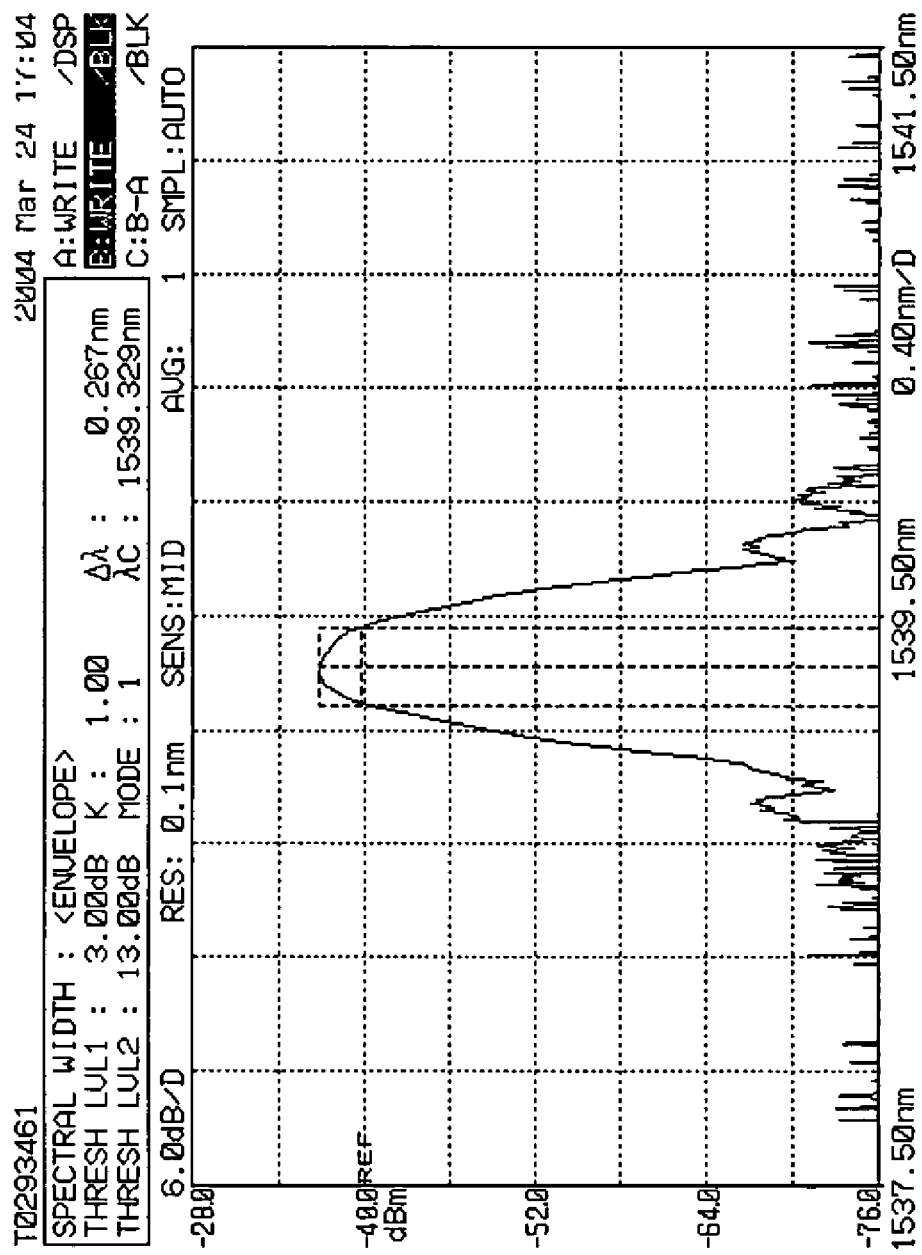

FIG. 8 is a graphical depiction of the optical profile of an embodiment of a chirped grating.

Figure 9:
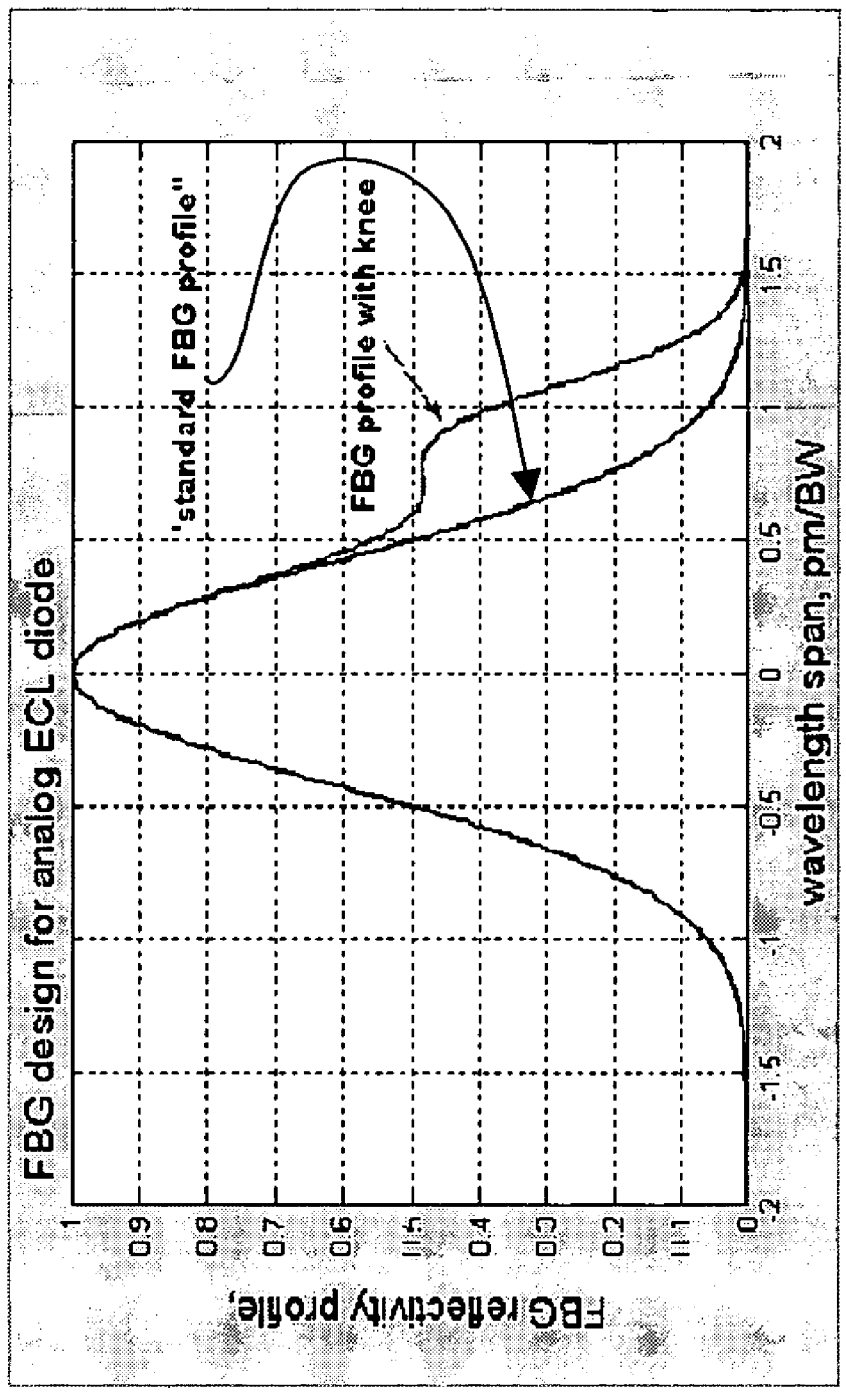

FIG. 9 is a graphical depiction of FBG reflectivity profile as a function of wavelength span. The "knee" spectral profile facilitates the alignment of the OSBDP (distortion dip) with the high chirp region as depicted in FIG. 12.

Figure 10:
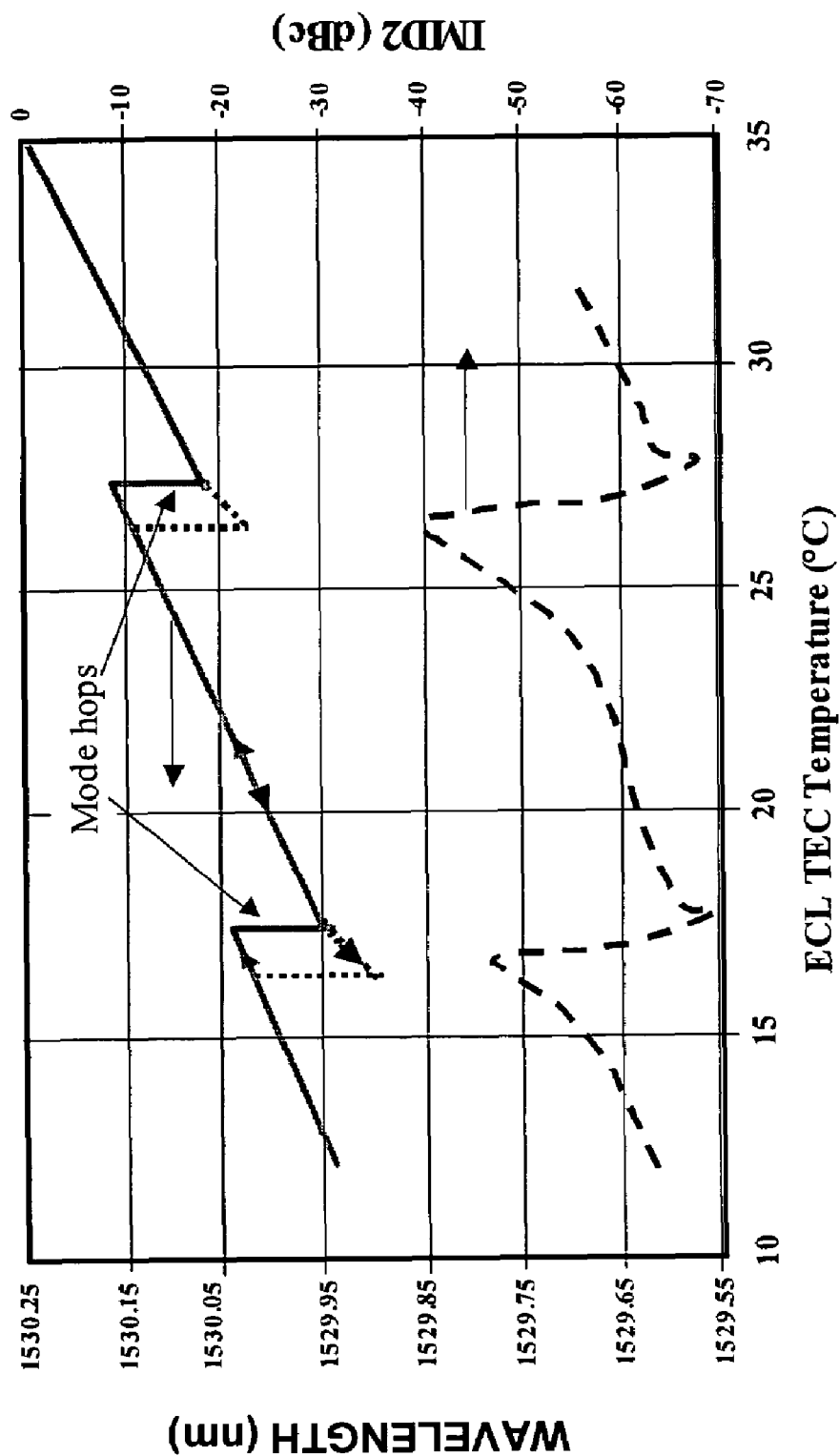

FIG. 10 (solid upper curve) is a graphical depiction of the ECL wavelength (in nm) as a function of ECL operating temperature (thermal electric cooler-TEC-temperature) showing mode hops and hysteresis effects when temperature is scanned both from warmer to cooler and from cooler to warmer. The dashed lower curve depicts second order distortion (e.g., IMD2 as a function of ECL temperature and shows distortion dips occurring at mode hop regions.

Figure 11:
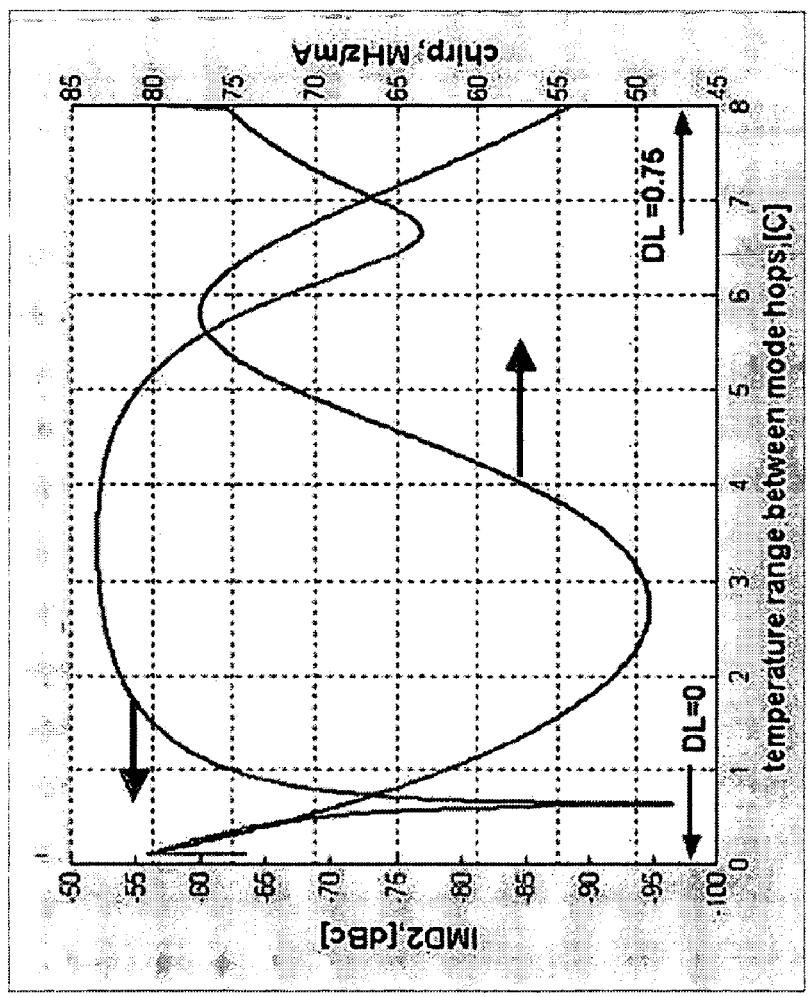

FIG. 11 is a graphical depiction of IMD2 (left vertical axis) and chirp (right vertical axis) as a function of the temperature range between mode hops for cases in which the FBG has a "knee profile." A secondary distortion dip is seen to occur with a wider operating temperature range.

Figure 12:
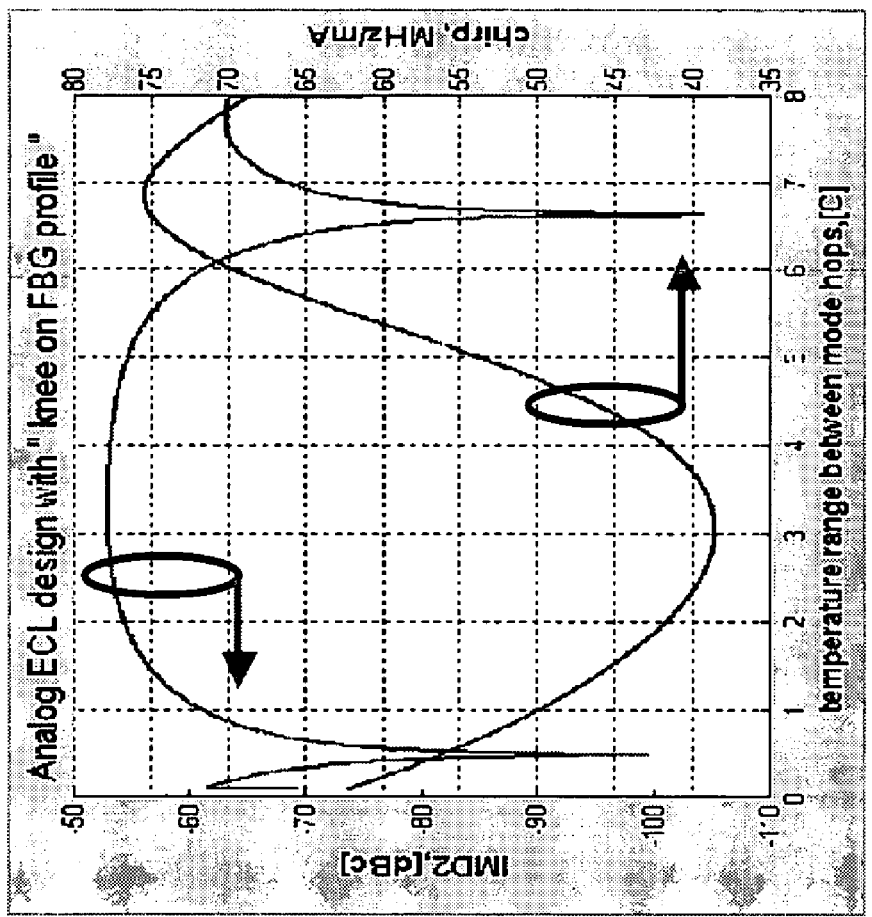

FIG. 12 is a graphical depiction of second order distortion (e.g., IMD2) (left vertical axis) and chirp (right vertical axis) as a function of the temperature range between mode hops for an embodiment of the FBG design (the FBG with knee profile) for an analog ECL for the example in which the one-sided butterfly profile (distortion dip) is aligned with maximum chirp. The figure depicts simulated results.

Figure 13:
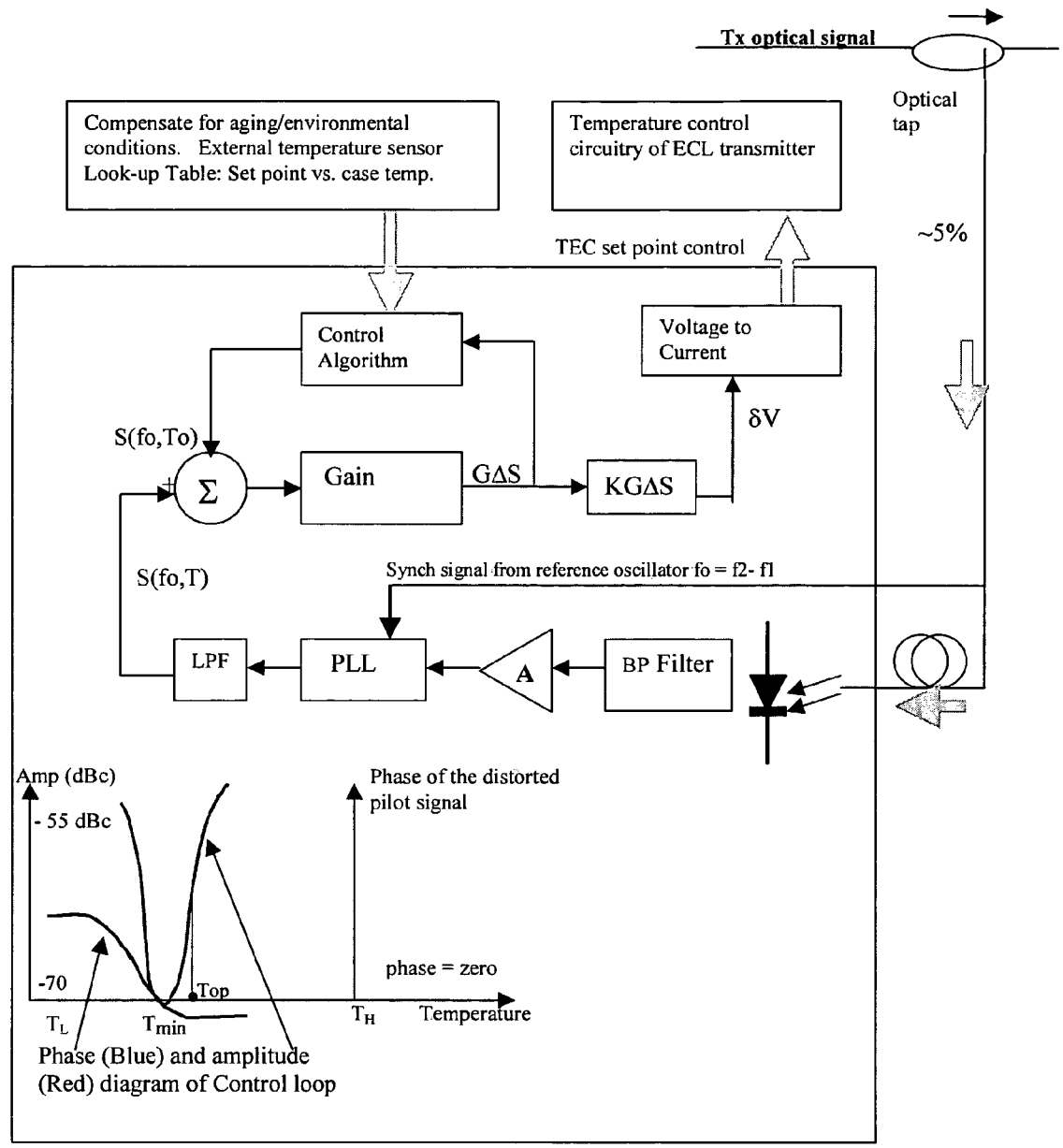

FIG. 13 is a schematic, block diagram depiction of an adaptive control loop for controlling and aligning OSBDP with the high chirp region in an analog ECL transmitter. PLL denotes Phase Locked Loop.

Figure 14:
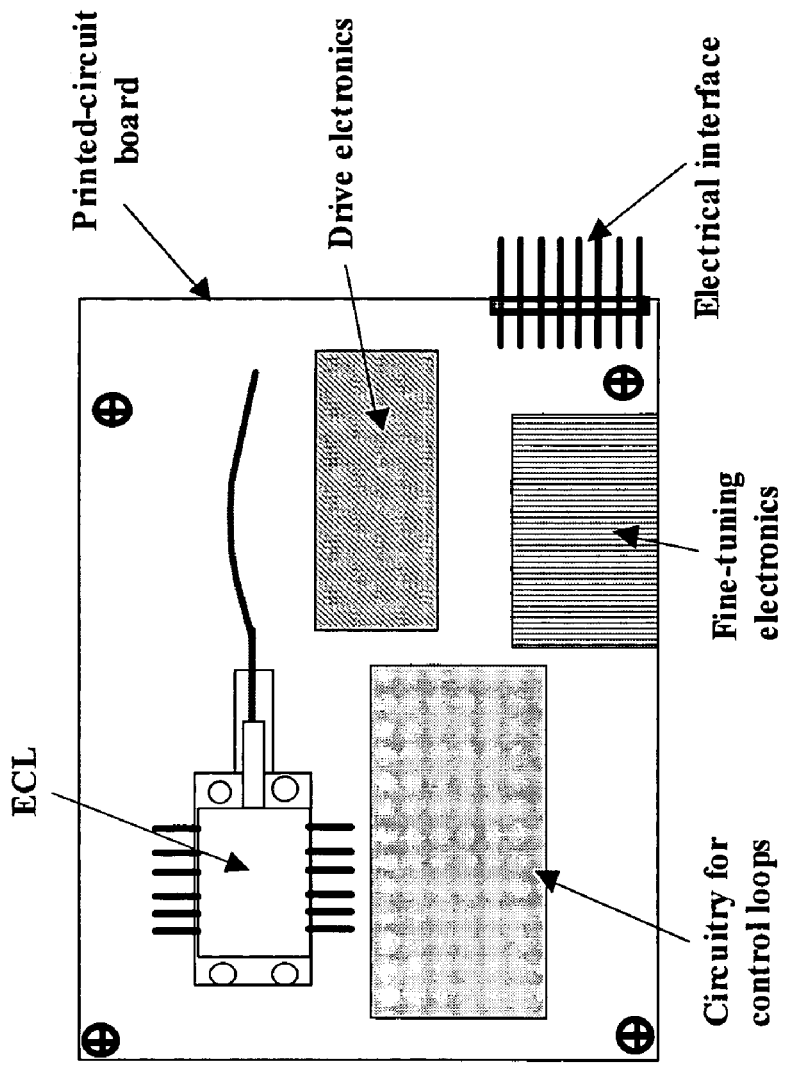

FIG. 14 is a schematic, block diagram depiction of an embodiment of a Distortion-Locked Laser (DLL). This analog transmitter subassembly includes a distortion-locked ECL in which the laser is locked to operate at the distortion dip.

DETAILED DESCRIPTION OF THE INVENTION

After considering the following description, those skilled in the art will clearly realize that the teachings of the invention can be readily utilized for the design, fabrication and/or use of analog optical transmitters including components and subsystems thereof.

The present invention relates to optical analog transmitters incorporating external cavity lasers, ECLs, as well as uses in and for broadcast and narrowcast applications. Typical structures for ECLs are given in FIG. 2 including a laser diode 200 having one side coated with an anti-reflective (AR) film or coating 201. The face of the laser diode opposite the AR film is coated with a highly reflective (HR) film or coating 202, thereby providing one reflective end of the optical feedback cavity. In addition to laser diode 200, typical ECLs also include other optical elements chosen to work in combination with the laser diode. Such optical elements and their optical characteristics can conveniently be represented by an optical transfer function, F. The optical transfer function, F(□), is typically a grating, sometimes referred to as a Bragg grating, 203. The Bragg grating reflects and transmits various portions of the light incident thereon from the laser diode where the fractions reflected and transmitted depend on the wavelength of the light, among other factors. Thus, simply stated, the Bragg grating functions as a mirror and as a filter. The reflective characteristics of the Bragg grating 203 form the laser's optical cavity in cooperation with the HR coating, 202. Light transmitted through the Bragg grating is the output of the laser, 204.

Since the operating (lasing) wavelength is typically a sensitive function of temperature, it is common practice to provide temperature sensing and temperature controlling devices in the ECL module or package to maintain a reasonably precise temperature and to maintain the operating temperature within a desired temperature range, for example, on the order of 15° C.-30° C. A widely used temperature controlling device is a thermal electric (or thermoelectric) cooler (TEC).

ECLs can be implemented in various embodiments, including but not limited to fiber-Bragg-grating (FBG) or planar lightwave circuit (PLC) type ECLs. FBG based external cavity lasers, illustrated in FIG. 2(a), typically include the FBG 203 written on silica single-mode fiber 205, typically by using common UV writing techniques. In typical PLC based external cavity lasers, the grating is written in a silica-based planar waveguide 206 as illustrated in FIG. 2(b). In other ECL embodiments, a bulk grating can be used for the optical transfer function. Yet other ECL embodiments include a tunable grating where the optical transfer function can be tuned using such techniques as spatial movement of the grating (e.g., using micro-electro-mechanical systems (MEMS)) or the application of an RF signal to tune an acousto-optic based optical transfer function, or by the application of heating or thermal stress to tune a thin-film based tunable optical filter, among other methods.

An important objective in the optical transmission of information is to increase the distance over which information can be transmitted and still be received in a form usable or acceptable to the recipient of this information. This is typically referred to as "reach". Efforts to extend reach are met by several challenges from the physics and engineering of optical transmissions. One of these is the chirp present in the laser which interacts with the dispersion in the fiber to degrade the transmitted signal, often severely. Another is the phenomena of "stimulated Brillouin scattering" (SBS) in which the vibrational modes or phonons of the fiber interact with the transmitted light and cause an increase in the noise and distortion level in addition to power saturation. SBS is one among several nonlinear optical effects that can arise and degrade system performance.

Intermodulation distortion (IMD) is among the effects to be considered when designing optical transmission systems and in choosing or developing components for use in such systems. IMD is characterized by effects of various interaction orders, with the $2^{nd}$ order IMD, (IMD2 or composite second order-CSO) being typically the most troublesome in practical optical transmissions. Reducing second order distortion is typically an advantageous procedure for reducing distortion in optical transmissions and, hence, increasing reach.

In order to carry information, the light emitted by the transmitting laser diode 200 is modulated, typically by modulating the current driving the laser, that is, direct modulation. However, in typical laser diodes, varying the drive current causes both the laser's output power and frequency to vary. This variation of laser frequency with drive current is called "chirp" and can typically be in the range from a few megahertz (MHz) to about 1 gigahertz (GHz) for each milliamp (mA) change in drive current.

It is generally advantageous for optical transmitters to provide a stable output wavelength, indicating that low (or zero) chirp is desirable. However, SBS typically increases for low chirp transmitters. That is, SBS effects can produce unacceptable distortion noise and losses in transmitted optical power when a single wavelength is launched down an optical fiber from a low chirp transmitter. While various optical fibers produce more or less SBS, typical optical transmission systems are constrained to use existing, already-installed fiber paths. Thus, various solutions to SBS losses typically focus on the properties of the light when launched into the fiber. One approach is to sacrifice some wavelength stability and to favor laser diodes having reasonable levels of chirp. In fact, intentional variation of transmitter wavelength through electronic "dithering" (applying drive current with intentional fluctuations) is a common method for suppressing, minimizing or reducing SBS. An object of the present invention is to provide an ECL transmitter having both low distortion and appropriate levels of chirp for use with typical fibers, thereby reducing SBS-induced losses. As described herein, the ECL pursuant to some embodiments of the present invention achieves this objective at reduced cost in comparison with previous techniques in the art.

An interesting and useful property of ECLs is depicted in FIG. 5 in which second order distortion for an analog ECL-based transmitter is plotted as a function of the ECL operating temperature, as typically controlled by a TEC. Striking reductions in second order distortion are seen to occur at certain operating temperatures and, as in FIG. 5, can recur at different operating temperatures. These "distortion dips" typically show the "one sided butterfly distortion profile" (OSBDP) as in FIG. 5. Producing, controlling and making use of these distortion dips in various ways are among the objects of the present invention.

FIG. 3 shows $2^{nd}$ order intermodulation distortion, IMD2, generated by a system consisting of a directly modulated laser with its optical output passing though a narrow bandwidth optical filter in which two different the phase delays φ between chirp response and intensity modulation are depicted and in which the laser is modulated using two small-amplitude sinusoidal tones at frequencies f1 and f2. One such system may consist of an "optically-enhanced" laser in which the output power of a distributed feedback (DFB) laser is coupled into an external filter as depicted in FIG. 4. Other systems include ECLs as described herein.

There are important differences between intermodulation distortion of an optically-enhanced laser and that of an analog transmitter incorporating an ECL. A typical analog transmitter incorporating an ECL exhibits a one-sided only butterfly profile in the distortion response map, which is represented by the right-hand side half (non-crosshatched) region in FIG. 3; while an analog transmitter incorporating an optically-enhanced laser has an intermodulation distortion region covering both regions in FIG. 3.

Analog transmitters incorporating ECLs as the laser source typically have "one-sided butterfly distortion profiles" (OS-BDP) which can occur throughout the range of ECL operating temperatures. Such one-side butterfly distortion profiles have several distinguishing features including an extremely low level of distortion, referred to as "distortion dip" (typically below about −65 dBc to about −70 dBc), but occurring at a relatively narrow range of ECL temperatures, usually less than about 1° C. We note that temperatures given herein are typically the temperature set by a thermoelectric cooler (TEC) that is commonly integrated into the ECL assembly. Such temperatures need not be precisely the operating temperature of the entire ECL but, since variations of properties with temperature is our primary interest, absolute temperature determinations are not usually required.

The experimental data plotted in FIG. 5 shows the one-sided only butterfly profile of an analog ECL-based transmitter and the periodic nature of this distortion dip across the operating temperature range of the ECL.

One aspect of the present invention relates to the design of the ECL in such a way as to increase the width of the "one-sided butterfly" feature or distortion dip. This widens the temperature range over which the ECL can operate with reduced values of distortion. As clearly shown in the experimental data of FIG. 5 and FIG. 6, the distortion dip of an ECL is usually less than about 1° C. at the "mouth" of the distortion dip and is just a few tenths of 1° C. at around the floor of the distortion dip. There are various methods for increasing the width of the distortion dip, including but not limited to:

(i) Applying a stress on the grating used as the optical transfer function of the ECL, for example, the FBG, or grating in a PLC waveguide, or bulk grating, or grating created by acousto-optic effect, among others. Stress can be applied through mechanical or thermal effects or a combination of both. An example is shown in FIG. 7 where the distortion dip broadening effect is obtained when a thermal stress is applied to the FBG of an analog ECL.

(ii) Employing novel designs for the grating such that the optical profile leads to wider distortion dips. Such designs for the grating include non-chirped gratings with a Gaussian-shaped optical profile with a full-width at half-maximum (FWHM) in the range of approximately 100 pm to about 400 pm (pm=picometer=$10^{-12}$ meter). Such designs for the grating also include chirped gratings as shown in FIG. 8, and FBG having a structure such that the reflectivity profile of the grating has a "knee" shape such as that shown in FIG. 9.

External cavity lasers typically exhibit regions of operation called mode hop regions in which the laser's output becomes metastable, leading to abrupt changes in the light-emitting characteristics of the laser. Thus, it is advantageous that optical transmitters operate away from mode hop regions.

Another aspect of the present invention relates to moving the "one-sided butterfly" feature or distortion dip away from the mode hop region to a more stable ECL operating region. The distortion dips in analog ECLs usually occur close to mode hops where the wavelength of the laser suddenly "hops" in some temperature intervals as depicted in FIG. 10. Due to the presence of hysteresis effects at the mode hop region, it is advantageous to design an analog ECL where the distortion dip is located away from the mode hop or to create another distortion dip away from the mode hop region. One method for moving the distortion dip away from a mode hop, or for creating a secondary distortion dip away from a mode hop region, is through the design of the grating and/or by applying controlled stress to the grating. The second distortion dip in FIG. 11 was enhanced when an FBG with a profile having "a knee" shown in FIG. 9 was incorporated inside an analog ECL. Other methods for manipulating the distortion dip include employing a FBG designed with a Gaussian shaped optical profile having a relatively large FWHM, typically in the range from about 200 pm to about 400 pm.

Another aspect of the present invention relates to tailoring the chirp in such a way as to provide an advantageous chirp level at the distortion dip where the chirp is high enough to adequately reduce SBS but not too large so as to limit the maximum reach of the transmitted analog signal. Having an analog transmitter incorporating an ECL with an extremely low level of distortion (such as that occurring at or near the minimum of the distortion dip) does not automatically guarantee adequate signal performance over the analog fiber link, because the low chirp nature of ECLs interacts with nonlinear effects in optical fibers to make SBS typically the limiting factor for the performance of the transmission link. Furthermore, existing methods of SBS suppression using dithering, which have been developed for DFBs and externally modulated sources, in addition to high cost, may be inadequate for suppression of SBS in ECL-based transmitters.

One approach to addressing the challenges arising from SBS in connection with ECL-based transmitters is to increase the chirp level while maintaining very low distortion. This can be accomplished pursuant to some embodiments of the present invention by arranging for the "one-sided butterfly distortion profile" (OSBDP), which corresponds to the distortion dip of the ECL, to occur at the same operating temperature as the high chirp region (or is "aligned along" the higher chirp region). This permits transmission of the low-distortion signal over an analog fiber-optic link without signal compression or other deleterious effects arising from SBS. It is important to note in connection with some embodiments of the present invention that, even within such higher-chirp regions of the ECL, the magnitude of the chirp produced by transmitters described herein is sufficiently small compared with standard DFB such that fiber dispersion-induced degradation is typically avoided or reduced to manageable levels.

FIG. 6 (experimental results) and FIG. 12 (simulated results) show two different designs of an ECL analog transmitter in which a one-sided butterfly profile (or distortion dip) is aligned along the region of high chirp. Such alignment of low distortion (OSBDP or distortion dip) and region of high chirp can be achieved by any or a combination of several means. One involves the modification of the spectral profile of the external cavity. One embodiment of modified spectral profile of the external cavity is the so-called "knee" spectral profile depicted in FIG. 9. This profile in FIG. 9 enables the alignment of the distortion dip with a relatively high chirp region. Other means for achieving the same or similar effect include the use of chirped spectral profile (chirped gratings written in the fiber such as to create the profile shown in FIG. 8, or chirped gratings written in the waveguide of PLC) or spectral profile in which chirp is introduced by external means such as gradients created by thermal or mechanical stress. For instance, thermal chirp can also introduced by suitable combinations of tapered metallization as described for example by B. J. Eggleton et al., "Dual on-fiber thin film heaters for fiber gratings with independently adjustable central wavelength and chirp," *Bragg Gratings, Photosensitivity, and Poling in Glass Waveguides* 1999 *Technical Digest*, p. 32, the entire contents of which is incorporated herein by reference for all purposes.

Another aspect of the present invention relates to the design and implementation of adaptive feedback control loops in order to lock the operation of the laser at the desired operating temperature where the distortion dip is aligned with an application-specific chirp region, that is, "distortion locking". An example of this adaptive control loop is illustrated in FIG. 13. The utilization of the proposed feedback control loop takes advantage of a useful feature of ECLs described above as distortion dip, and can significantly improve manufacturing yields compared with analog transmitters described in the prior art.

Since the OSBDP occurs over a narrow ECL temperature range (typically less then about 1° C.) where the distortion sensitivity is very high (typically in the range from about 5 10 dB/° C. to about 10 dB/° C.), it is advantageous to adjust the operating temperature point precisely to compensate for changing environmental conditions and drift due to transmitter aging.

Since the position of the distortion minimum is largely frequency independent, one can implement the feedback loop by applying two pilot electrical signals at close frequencies f1, f2, where f2=f1+fo, generated from the same source. These frequencies are advantageously chosen in such a way as not to interfere with existing RF analog carriers within CATV/QAM transmission bandwidth.

When two RF pilot signals f1 and f2 with fixed phase difference (as typically generated from the same oscillator) are applied to the ECL transmitter, then due to the mechanism of a fundamental distortion arising from nonlinear optical effects, the optical output of the transmitter will have a 2nd order distortion signal at f=f2−f1 or f=f2+f1. This output optical signal can be tapped from the ECL fiber pigtail using an optical tap coupler as shown in FIG. 1 or by using light from the back-facet of the ECL laser. But in either case, the photodetector used to convert the optical signal should have a sufficiently large bandwidth so the signal at frequency f can be detected properly. As shown in FIG. 13, the signal is typically filtered through the BP (bandpass) Filter then amplified before the phase information (in-phase and quadrature components) is extracted, typically using a phase detector and a reference oscillator.

The operating temperature of the ECL transmitter can be set substantially at the minimum of OSBDP (the floor of the distortion dip) or slightly on the right (higher temperature)

side of it. If the temperature is set so that the ECL operates at or near the minimum distortion (phase=0) then the direction of the Error signal, ΔS, will be determined by the change in the sign of the quadrature component. If the temperature operating point is set so as to cause an offset from the distortion minimum, then the direction of Error signal, ΔS, will be determined by the relative change in the amplitude of the signal. Additionally, the sign of the phase signal can be used as a control signal in order to prevent run-away of the control loop, since left- and right-slopes have different phase sign.

Assume now that under conditions of slow environmental changes the operating point is shifted by δT>0 to Top=To+δT, where To is the initial ECL operating temperature (TEC temperature). In order to compensate for such changes, one can generate an error signal. Due to the changes in temperature, the amplitude of the distorted signal S(f2-f1) will typically increase and move away from the offset S(To). Error signal ΔS=S(fo, To+δT)-S(fo, To) will be generated and amplified by a gain block of the control loop. Then the resulting signal with sensitivity K will be applied to TEC control circuitry via a voltage-to-current converter to compensate for δT. This adaptive feedback loop, including modifications and alternative embodiments apparent to those having ordinary skill in the art, enable the analog ECL transmitter to be compensated for environmental changes and changes due to aging.

Another aspect of the invention relates to integration of a distortion-locked ECL inside a transmitter subassembly, which is a subset of an analog transmitter. We refer to this transmitter subassembly as a distortion-locked laser (DLL) and is illustrated in FIG. 14. The DLL is used as a building block of an analog transmitter. This transmitter subassembly or DLL comprises an ECL with enhanced distortion dip, and with an appropriate chirp level at or near that distortion dip for improved SBS suppression without substantial sacrifices in the reach of the link. The transmitter subsystem also typically includes dynamic feedback control loops to lock the ECL to operate at or near the distortion dip, including but not limited to the embodiment of such control loops described herein. The transmitter subassembly also includes drive electronics such as RF amplifiers, temperature controllers, and circuitry for fine-tuning of the operating conditions of the DLL. In addition, the analog transmitter incorporating analog ECL pursuant to some embodiments of the present invention may, optionally, include predistortion circuitry that acts on the ECL to correct for the degradation of the second and third order harmonic distortion as the optical signal travels through the optical fiber.

In addition, the analog transmitter incorporating analog ECL pursuant to some embodiments of the present invention may, optionally, include circuitry providing for electronic dispersion compensation acting on the ECL to reduce signal degradation caused by dispersion arising from signal propagation inside a standard single mode fiber.

In addition, the ECL incorporated in an analog transmitter pursuant to some embodiments of the present invention may, optionally, include an in-line optical isolator to suppress optical power and preventing it from coupling back into the cavity of the ECL, thereby reducing or eliminating a major source of noise in the analog transmission system.

Although various embodiments which incorporate the teachings of the present invention have been shown and described in detail herein, those skilled in the art can readily devise many other varied embodiments that still incorporate these teachings.

What is claimed is:

1. A temperature-controlled external cavity laser system comprising:

a laser cavity with an optical reflecting and filtering element that produces an optical signal with a temperature dependent distortion, said laser cavity having a transfer function with an enhanced distortion dip within a predetermined temperature range that defines a relative minimum in distortion;

an oscillator that generates two radio frequency pilot signals having different frequencies and a fixed phase difference, the two radio frequency pilot signals applied to said external cavity laser, thereby producing in the optical output of said laser a distortion signal at the frequency difference of said pilot signals;

in-phase and quadrature component information of the two pilot signals extracted from said distortion signal;

an error signal generated from said in-phase quadrature information; and one or more temperature controllers wherein the operating temperature of said laser is changed in response to the error signal such as to cause said laser to operate in or near the temperature region of the distortion dip of said laser.

2. An external cavity laser as in claim 1 wherein said laser has a temperature region of operation having predetermined chirp approximately at said temperature region of said distortion dip.

3. An external cavity laser as in claim 2 wherein said predetermined chirp is application-specific.

4. An external cavity laser as in claim 1 wherein mode hops of said laser are absent from said temperature region of said distortion dip.

5. An external cavity laser as in claim 1 wherein the emission wavelength of said laser at said temperature region of said distortion dip substantially coincides with at least one wavelength of the standard grid for wavelength division multiplexed systems.

6. An external cavity laser as in claim 1 further comprising one or more temperature sensors and a feedback loop connecting said sensors and said temperature controllers such that the temperature of said laser substantially remains in said temperature region of said distortion dip.

7. An analog transmitter comprising a temperature-controlled external cavity laser as in claim 1.

8. A method of controlling the width of the temperature region over which a distortion dip occurs and an operating point within that width in a temperature-controlled external cavity laser where said distortion dip defines a relative minimum in distortion, said laser comprising a light source within an optical feedback cavity wherein one end of said optical feedback cavity is a partially-reflective grating, said method comprising a) applying two radio frequency pilot signals having different frequencies and a fixed phase difference to said external cavity laser, thereby producing in the optical output of said laser a distortion signal at the frequency difference of said pilot signals; and, b) extracting in-phase and quadrature component information of the two pilot signals from said distortion signal; and, c) generating an error signal from said in-phase and quadrature component information; and d) adjusting the temperature of the external cavity laser within the width of the temperature region and wherein the width of the temperature range is controlled by at least one of:

a) applying stress to said grating wherein said stress is thermal stress, mechanical stress or both; and, b) employing a non-chirped grating having transmission bandwidth in the range from approximately 100 picometers to approximately 400 picometers full-width at half-maximum as said partially-reflective grating; and, c) employing a chirped grating as said partially-reflective grating; and, d) employing a grating having a knee-shaped reflectivity profile as said partially-reflective grating.

9. A method of distortion locking a temperature-controlled external cavity laser operating within a distortion dip comprising:

a) applying two radio frequency pilot signals having different frequencies and a fixed phase difference to said external cavity laser, thereby producing in the optical output of said laser a distortion signal at the frequency difference of said pilot signals; and, b) extracting in-phase and quadrature component information of the two pilot signals from said distortion signal; and, c) generating an error signal from said in-phase and quadrature component information; and, d) adjusting the temperature of said temperature-controlled external cavity laser so as to reduce said error signal to a value near zero within the distortion dip where said distortion dip defines a relative minimum in distortion.

10. A method of distortion locking a temperature-controlled external cavity laser comprising:

a) applying two radio frequency pilot signals having different frequencies and a fixed phase difference to said external cavity laser, thereby producing in the optical output of said laser a distortion signal at the frequency difference of said pilot signals; and, b) extracting in-phase and quadrature component information of the two pilot signals from said distortion signal; and, c) generating an error signal from said in-phase quadrature component information; and, using the generated error signal, a thermal electrical cooler and a temperature sensor forming a thermal control loop whereby the operating temperature of the external cavity of said external cavity laser is maintained substantially at a value whereby the output signal of said laser is locked simultaneously at an enhanced distortion dip and at an emission wavelength substantially at a wavelength of the standard grid for wavelength division multiplexed systems where said enhanced distortion dip defines a relative minimum in distortion.

11. An application-specific analog transmitter for broadcast and narrowcast transmission, said transmitter operating at a wavelength substantially at a wavelength of the standard grid for wavelength division multiplexed systems, said transmitter comprising:

a temperature-controlled external cavity laser;

two radio frequency pilot signals having different frequencies and a fixed phase difference applied to said external cavity laser, thereby producing in the optical output of said laser a distortion signal at the frequency difference of said pilot signals; and, in-phase and quadrature component information of the two pilot signals extracted from said distortion signal; and, an error signal generated from said in-phase and quadrature component information;

wherein the temperature-controlled external cavity laser is locked to simultaneously operate substantially at an enhanced distortion dip and at a pre-determined chirp in response to the error signal where said enhanced distortion dip defines a relative minimum in distortion.

12. An external cavity laser as in claim 1 further comprising predistortion circuitry acting on said laser to reduce second order harmonic distortion, third order harmonic distortion or both.

13. An external cavity laser as in claim 1 further comprising circuitry providing electronic dispersion compensation acting on said laser so as to reduce signal degradation caused by the propagation of the optical signal generated by said laser inside an optical fiber.

14. An external cavity laser as in claim 1 further comprising an in-line optical isolator to suppress reflected optical power from coupling back into the cavity of said laser.

* * * * *